United States Patent [19]

Kuech et al.

[11] Patent Number: 5,036,022
[45] Date of Patent: Jul. 30, 1991

[54] METAL ORGANIC VAPOR PHASE EPITAXIAL GROWTH OF GROUP III-V SEMICONDUCTOR MATERIALS

[75] Inventors: Thomas F. Kuech, Peekskill; Michael A. Tischler, Jefferson Valley, both of N.Y.

[73] Assignee: International Business Machines Corporation, Armonk, N.Y.

[21] Appl. No.: 607,846

[22] Filed: Nov. 1, 1990

Related U.S. Application Data

[63] Continuation of Ser. No. 215,181, Jul. 5, 1988, abandoned.

[51] Int. Cl.$^5$ ............................................. H01L 21/20
[52] U.S. Cl. .............................. 437/81; 148/DIG. 26; 148/DIG. 110; 437/89; 437/939; 437/971
[58] Field of Search .................... 148/DIG. 6, 17, 22, 148/26, 56, 65, 72, 95, 97, 110, 119, 169; 156/610–615; 427/252, 255.1; 437/81, 89, 90, 88, 99, 105, 107, 126, 133, 925, 939, 946, 949, 976

[56] References Cited

U.S. PATENT DOCUMENTS

| | | | |
|---|---|---|---|
| 4,147,571 | 4/1979 | Stringfellow et al. | 437/128 |
| 4,436,769 | 3/1984 | Moss et al. | 427/252 |
| 4,568,397 | 2/1986 | Hoke et al. | 156/613 |
| 4,745,088 | 5/1988 | Inoue et al. | 437/102 |
| 4,826,784 | 5/1989 | Salerno et al. | 437/89 |

FOREIGN PATENT DOCUMENTS 2830081  2/1979  Fed. Rep. of Germany .

OTHER PUBLICATIONS

Sasaoka, C. et al., Atomic Layer Epitaxy of GaAs Using Solid Arsenic and DEGaCl, Japanese Journal of Applied Physics, vol. 27, No. 4, Apr. 1988, pp. L490–L492.

"Source of Carbon Contamination in GaAs Grown by Metalorganic–Chloride (Ga(CH$_3$)$_3$/AsCl$_3$/H$_2$) VPE," Yoshida, Masaji, *Journal of Crystal Growth*, 88: 16–22 (1988).

Abstract—"Isothermal Low Pressure Metalorganic Chemical Vapor Deposition—A Novel Approach to Multi-Wafer Epitaxy", R. J. M. Griffiths and R. R. Bradley, Plessey Research and Technology, Third Biennial OMVPE Workshop 9/21–23 (1987).

Maury et al., "Epitaxial Growth . . . Using Diethylgallium–Chloride–Triethylassine . . . ", J. Crys. Growth, 62 (1983), pp. 568–576.

Yoshiro Nakayama et al., Submicron GaAs Epitaxial Layer from Diethylgalliumchloride and Arsine, J. Electrochem. Soc., Solid-State Science and Technology, Aug. 1976, pp. 1227–1231.

K. Lindeke et al., Gallium Diethyl Chloride: A New Substance in the Preparation of Epitaxial Gallium Arsenide, J. Electrochem. Soc.: Solid State Science, Oct. 1970, pp. 1316–1318.

K. Kamon et al., Selective Growth of Al$_x$Ga$_{1-x}$ as Embedded in Etched Grooves on GaAs by Low-Pressure OMVPE, Journal of Crystal Growth 77 (1986), pp. 297–302.

(List continued on next page.)

*Primary Examiner*—Olik Chaudhuri
*Assistant Examiner*—William Bunch
*Attorney, Agent, or Firm*—Scully, Scott, Murphy and Presser

[57] ABSTRACT

This invention is directed to a method of epitaxial growth by metal organic vapor phase epitaxy (MOVPE) of Group III-V compound semiconductors in a hot wall reactor. Epitaxy is accomplished by use of precursors having a metal, an organic ligand, and an inorganic ligand. The system is operated at very low pressures to provide a high throughput of wafers and a highly uniform deposition growth. The invention is further directed to the use of the class of precursors to selectively grow III-V compounds on a masked substrate, wherein growth occurs epitaxially on the exposed areas of the substrate but not on the surrounding mask.

35 Claims, 2 Drawing Sheets

OTHER PUBLICATIONS

H. Heinecke et al., Selective Growth of GaAs in the MOMBE and MOCVD Systems, Journal of Crystal Growth 77 (1986), pp. 303-309.

Kazuo Mori et al., GaAs Growth by Atomic Layer Epitaxy Using Diethylgalliumchloride, Appl. Phys. Lett. 52(1), Jan. 1988, pp. 27-29.

C. Ghosh et al., Selective Area Growth of Gallium Arsenide by Metalorganic Vapor Phase Epitaxy, Appl. Phys. Lett. 45(11), Dec. 1984, pp. 1229-1231.

Stephen H. Jones et al., Selective Area Growth of High Quality GaAs by OMCVD Using Native Oxide Masks, J. Electrochem.Soc.: Solid-State Science and Technology, Dec. 1987, pp. 3149-3155.

Tasashi Ueda et al., Selective Growth of GaAs by Reduced Pressure MOCVD Using TMG and TEG, Extended Abstracts of 18th International Conference on Solid State Devices & Materials, Conf. Date Aug. 20-22, 1986.

METAL ORGANIC VAPOR PHASE EPITAXIAL GROWTH OF GROUP III-V SEMICONDUCTOR MATERIALS

This application is a continuation of application Ser. No. 215,181, filed on July 5, 1988, now abandoned.

DESCRIPTION

This invention relates generally to epitaxial growth, and more particularly, to epitaxial growth of Group III-V semiconductor materials. The technique employed is metal organic vapor phase epitaxy (MOVPE). The MOVPE technique involves introducing vapors of the reactants and/or precursors into a reaction vessel wherein a chemical reaction occurs to provide the epitaxial Group III-V material. Group III-V compound semiconductors have applications, for example, in light-emitting diodes, field effect transistors and lasers.

PRIOR ART

The growth of epitaxial material of high electrical and physical quality has been achieved in a variety of growth techniques. The metal-organic vapor phase technique is one of the most versatile and commercially desirable of the techniques. The growth by MOVPE is, in general, a conformal process.

In conventional MOVPE techniques for the epitaxial growth of Group III-V materials, the Group III or the Group III and Group V metals are provided by metal-alkyl reactants in vapor form. Since these metal-alkyl reactants decompose at low temperatures into carbides and metal-alkyl polymers, the MOVPE technique is typically undertaken in a system wherein only the substrate is heated and the reactor walls are cold to prevent the predeposition of the decomposed reactants onto the reactor walls. The substrate is selectively heated typically by an external rf induction coil that couples energy through the reactor wall to the susceptor which in turn heats the wafers, or by an external radiant heater in direct contact with the reactor wall. The reactor tube is conventionally made of quartz which is transparent to the radiant heating and rf induction thereby remaining cool.

This typical MOVPE cold-wall reactor is limited in the number of substrates and in total substrate area where useful deposition can occur. This limited area of useful deposition is attributed to complicated chemistry in addition to complex, geometry dependent, fluid flow in these cold wall systems which are operated in the near atmospheric pressure regime (10-760 torr). Uniform growth is found only over a limited area due to the mass transport limited nature of the growth process at these conventional pressures. The use of lower reactor pressures using the conventional MOVPE growth chemistries of trimethyl gallium, trimethyl aluminum and their analogues in the In based systems, result in the high incorporation of carbon leading to undesirable materials properties. The conventional precursors used in the MOVPE process use three similar or identical saturated hydrocarbon, ligands such as triethyl gallium, Ga($C_2H_5$)$_3$, Diethylmethyl In, ($C_2H_5$)$_2$InCH$_3$, and so on. These precursors decompose at low temperatures requiring a cold wall system in order to insure their transport to the growth area without a pre-reaction and decomposition on the inadvertently heated reactor walls.

A method for vapor epitaxial deposition of Group III-V compounds utilizing Group III organometallic compounds, such as triethylgallium and trimethylaluminum, in the presence of gaseous halogen or hydrogen halides is disclosed in U.S. Pat. No. 4,147,571. The system has application in cold-wall and hot-wall systems.

The use of diethylgalliumchloride and arsine for epitaxial growth in a cold wall system at atmospheric pressure was reported by K. Kindkete, W. Sack and J.J. Nick in J. Electrochem. Soc. 117 (Oct 1970) and Y. Nakayama, S. Ohkawa, H. Hashimoto and H. Ishikawa in J. Electrochem. Soc. 123, 1227 (1976).

MOVPE growth on patterned substrates where part of the free surface of the semiconductor is covered by masking material, e.g. $SiO_2$, $SiO_2$, $SiN_x$, etc., results in a deposition of material over the entire surface. The material deposited on the mask is poly-crystalline (S.H. Jones and K.M. Lau, J. Electrochem. Soc. 134, (1987)3149) while the material deposited on the substrate through openings in the mask is single crystal. In order to achieve no deposition on the masking material, as opposed to poly-crystalline deposition, workers have to go to high growth temperatures, lower reactor pressures, and low growth rates (H. Heinecke, A. Brauers, F. Grafahrend, C. Plass, N. Putz, K. Werner, M. Weyers, H. Luth, and P. Balk, J. Crystal Growth, 77, (1987)303). In these latter studies, low supersaturation must be maintained in the growth ambient to prevent the nucleation of GaAs on the mask. In all cases complicated edge morphologies arise at the boundary of the mask. This is attributed to the diffusion of growth species from the mask surface to the edge of the growing film.

The lack of selectivity in conventional MOVPE arises from the choice of chemical precursor. Metal sources such as triethyl gallium, trimethyl gallium and trimethyl aluminum, all decompose readily to yield metallic deposits. In order to get selective growth the evaporation of the metallic deposit must take place before sufficient metal is deposited to nucleate a poly-crystalline deposit. This means providing a low supersaturation in the growth ambient such that the driving force for growth is small. This is accomplished in conventional MOVPE by low growth rates, high growth temperatures and low growth pressures.

SUMMARY OF THE INVENTION

The present invention is directed to a method for growing Group III-V epitaxial layers in a hot wall system, wherein the precursors for providing the Group III metal contain a Group III metal, an organic ligand and an inorganic ligand. The precursor is of the form:

$$MR_{2-y}X_{1+y}$$

wherein
M is a Group III metal atom;
R is alkyl or halo-substituted alkyl;
X is halogen; and
y is 0 or 1.

In accordance with the method of the invention, a substrate of a material suitable for epitaxial growth is positioned in a hot wall reactor. A gaseous mixture is introduced into the chamber that includes at least one organometallic halide compound of a Group III metal and at least one compound of a Group V element under conditions of suitable temperature and pressure to deposit on the substrate an epitaxial layer of a III-V compound.

At low temperatures compared to those required for epitaxial growth, the R substituents fissure from the precursor resulting in a transition species of the formula MX. It is the MX which reacts with the Group V metal source to provide the Group III-V compound. The Group V metal is provided by elemental Group V species, Group V hydrides or other Group V compounds.

The MX species is stable at high temperatures thereby enabling the described class of precursors to be employed in a hot wall system. In addition, the precursors described above will not deposit the compound semiconductor onto the reactor walls under a wide range of growth conditions. The suppression of the growth on the reactor interior walls further enables the use of a hot wall reactor. Moreover, the mass transport of growth nutrients to the substrate surface is enhanced by operation of the hot wall reactor at low pressures of less than 10 torr, typically in the range 0.001 torr to 10 torr. This allows for a large number of wafers to be processed simultaneously in the system with a highly uniform growth of the deposition over the entire substrate surface.

Heterojunctions can be grown in this system by altering the reactants introduced into the MOVPE system. The low pressure operation of the reactor allows for the rapid exchange of gases in the reactor tube and a sharp transition between heterojunctions. Highly uniform doping can also be accomplished as the incorporation of the dopant at low pressures is only dependent on temperature.

In another embodiment, selective epitaxy using the described class of precursors is obtained in a hot or cold wall system. The precursors of the invention provide growth of Group III-V materials on the unmasked areas of a masked substrate while preventing growth on the mask. The MX species does not adsorb strongly to the masking material due, in part, to its high volatility. In addition, the halogen compounds, such as HCl, resulting as a growth reaction by product in the growth environment, act to etch and remove any small embryonic crystals from the mask surface before a critical nuclei can be formed.

DETAILED DESCRIPTION OF THE INVENTION

The present invention provides a method for epitaxially growing III-V semiconductor compounds on a semiconductor substrate by MOVPE in a hot wall reactor. The invention utilizes precursors which possess both organic as well as inorganic ligands on the metal bearing species. The precursors are organometallic compounds of the form:

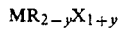

wherein
M is a Group III metal atom,
R is alkyl or halo-substituted alkyl,
X is halogen, and
y is 0 or 1.

In accordance with the method of the invention, at least one of the above organometallic compounds and at least one compound of a Group V element are introduced into a hot wall reactor of a MOVPE system under suitable temperature and pressures to epitaxially deposit a III-V compound on a semiconductor substrate. The Group III metal atom, M, may be any of Al, Ga or In, and the Group V atom may be any of As, P or Sb. For example, the alkyl or alkyl moiety contains 1-6 carbon atoms, preferably 1-3 carbon atoms, and especially methyl and ethyl. Thus, the organic ligand may be any of $CH_3$, $C_2H_5$ or $C_3H_5$. The inorganic ligand, X, may be any of F, Cl, I or Br. In addition, the organic ligand could have halogen substituted for the H, for example, $CF_3$ or $C_2Cl_5$.

The organic ligands fissure from the starting precursor at low temperatures compared to that required for epitaxial growth. The resulting species is of the form MX. This species is stable at high temperatures and therefore, a hot wall reactor system may be utilized in place of the conventional cold wall reactor. The class of precursors of the invention will not deposit the compound semiconductor onto the reactor walls under a wide range of growth conditions. The suppression of the growth on the reactor interior walls further enables the use of a hot-wall reactor.

In a hot wall reactor the use of RF induction or radiant heating typically used in a cold wall reactor is replaced by a furnace to maintain a temperature preferably in the range of 200°-800° C. The hot wall system is a flow system in which source gases are introduced into the reaction chamber and pumps are located on the reaction chamber to maintain the operating pressure. The pressure is determined by the amount and flow of the gas species in the chamber.

Figure 1:
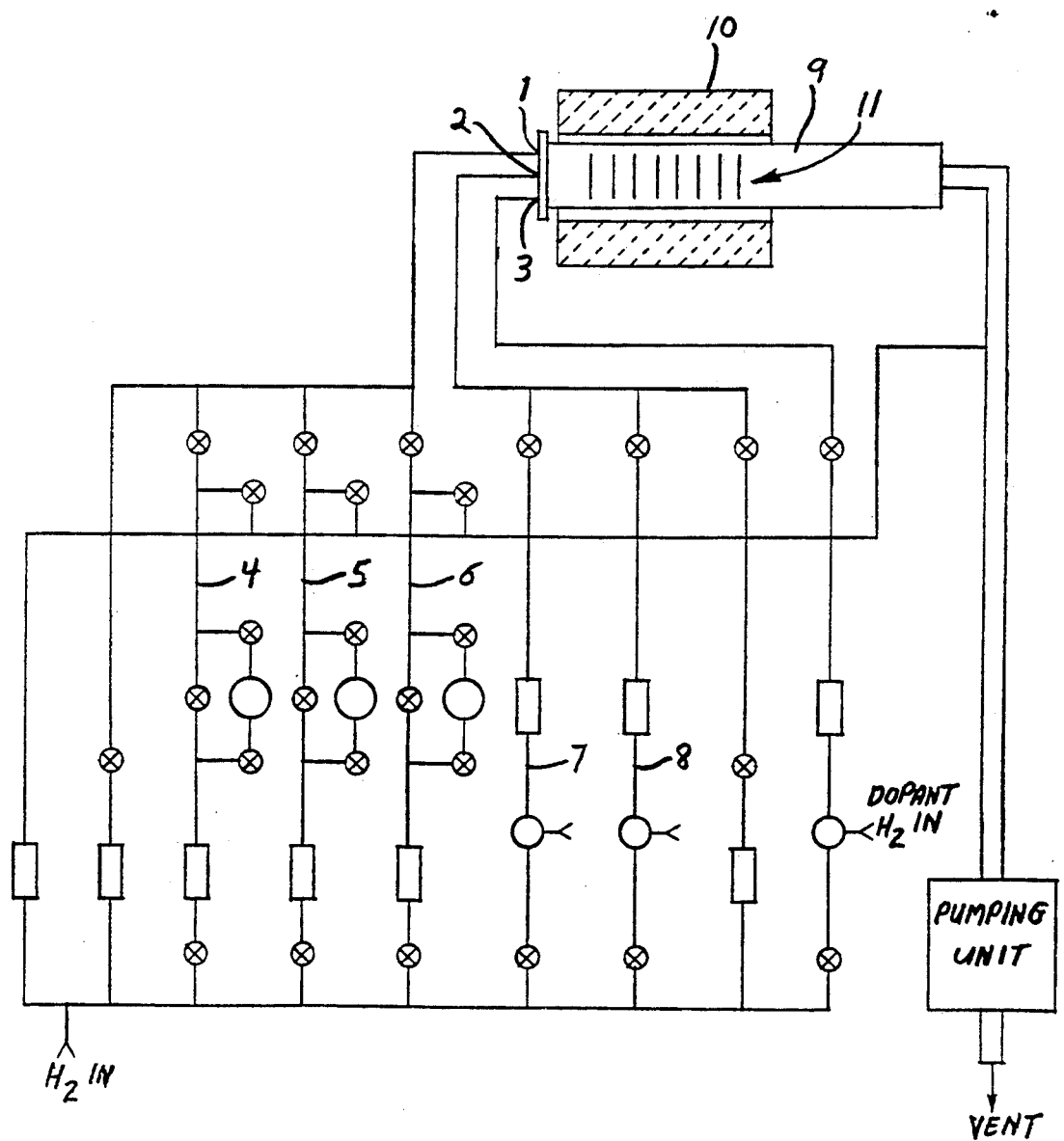
FIG. 1 schematically illustrates a hot wall MOVPE reactor and gas panel for use with the precursors of the invention.

As shown in FIG. 1, the Group III organometallic halide vapors are supplied to the reactor from the gas panel through entry port 1 and the group V source vapors are supplied through entry port 2. The gas panel is the same as is used in cold wall reactors and described in Kuech, Material Science Reports V 2, 1987 page 6, incorporated herein by reference. Depending upon the number of group III elements in the semiconductor compound to be formed, the corresponding group III organometallic compounds are supplied to the reactor through entry port 1 via one of more of lines 4, 5 and 6. If only one group III element is in the semiconductor compound then one line is used whereas if two or three group III elements are in the semiconductor compound then two or three lines, respectively, are used to supply the different group III organometallic compounds. Similarly, depending upon the number of Group V atoms in the semiconductor compound to be formed, the corresponding group V sources are supplied to the reactor through entry port 2 via lines 7 and 8. The reactor consists of a quartz tube 9 in a furnace 10. At higher pressures a throttled mechanical pump is adequate whereas at lower pressures a turbo-molecular pump is more suitable.

Volatizable elemental Group V species, Group V hydrides or other Group V compounds are used as the source of the Group V atom to form the III-V semiconductor compound. A plurality of vapor flows are introduced into the reaction chamber including a Group III organometallic halide vapor having a mole fraction in the range of 0.5 to $10^{-3}$ and a Group V source vapor having a mole fraction in the range of 0.5 to $10^{-3}$. The reaction chamber is heated and the Group III organometallic halide vapor dissociates to form a metal halide vapor which chemically reacts with the Group V compound vapor to form the epitaxial layer. The thickness of the epitaxial layers so produced depends upon the growth rate and the time of deposition which are in turn generally controlled by the temperature, reactor pressure and mole fraction of the reactants.

In accordance with another embodiment of the invention, the hot-wall reactor is operated at very low pressures, less than 10 torr, preferably in the range 0.001 to 10 torr. The low pressure conditions enhances the mass transport of growth nutrients to the surface. Thus, the rate limiting step to growth will be a temperature dependent reaction. The low pressure also provides rapid transport of the growth constituents to the growth surface. The combination of low pressure and a hot wall system allows for the high density stacking of the substrates into the hot wall reactor and a highly uniform growth of the deposition over the entire substrate surface. In the present invention, batch processing of wafers can be achieved with excellent uniformity of deposition, both on a wafer and from wafer to wafer. For example, batch processing may be achieved in the present system by vertical stacking of a large quantity of wafers as shown at 11 in FIG. 1. Such an arrangement allows for a small interwafer spacing which may be as low as 1-10 millimeters. Thus, a high throughput of epitaxial growth is obtained by use of the described class of precursors in a hot wall reactor at very low pressures.

Compound semiconductor structures may be grown using the method of the invention in which there is a single metal atom M and a single Group V element, such as GaAs, InP and AlAs. Alloy compound semiconductors having multiple Group III metal atoms may also be grown by introducing a plurality of organometallic precursors into the system. For example, the growth of compound semiconductors having two Group III metal atoms, such as, $Al_xGa_{1-x}As$ where $0 \leq x \leq 1$, is accomplished through the introduction of both a Ga and an Al bearing organometallic halide precursor such as Diethyl Gallium Chloride and Dimethyl Aluminum Chloride. The growth of AlGaP is similarly accomplished by substituting P for As as the Group V atom. Furthermore, three Group III organometallic halide precursors can be provided to form a compound semiconductor having three Group III metal atoms, such as, $(Al_xGa_{1-x})_yIn_{1-y}P$ where x is in the range $0 \leq x \leq 1$ and y is in the range of $0 \leq y \leq 1$. Semiconductor compounds containing two different Group III elements and two different Group V elements are formed by providing two different Group III organometallic compounds and two different group V sources. A III-V compound of this form is $In_xGa_{1-x}As_yP_{1-y}$ where x is in the range $0 \leq x \leq 1$ and y is in the range $0 \leq y \leq 1$. Any Group III-V compound may be made by introducing the appropriate precursors.

The process of the invention has further application to the growth of heterojunctions through a change in the composition of the gases inputted to the growth reactor. The low pressure operation of the reactor allows for the rapid exchange of gases in the reactor tube and hence a sharp transition in the composition of the deposited films. Through changing the flow of the Group III or Group V precursors into the reactor, changes on the cation or anion sublattice are effected. Thus, heterojunctions of, for example, AlGaAs/GaAs on a GaAs substrate may be formed in-situ by first epitaxially grown GaAs in a first step and then epitaxially growing AlGaAs in a second step by adding the Al bearing precursor.

In-situ doping is possible by introducing dopant source gases through entry port 3 at the time of introduction of the Group III and Group V source gases, or during interruptions in the epitaxial deposition. N and P type doping is accomplished through the controlled introduction of conventional gas compounds such as silane, disilane, dimethyl zinc or other Group IIB, IV or VI compounds. The dopant incorporation into the growing film is dependent on temperature and pressure. The hot wall reactor operated at very low pressures results in a highly uniform incorporation of doped material.

In another aspect of the invention, the precursors of the invention provide selective epitaxial growth of Group III-V compounds on a masked substrate in an MOVPE system. The class of precursors described herein containing a Group III metal, an organic ligand and an inorganic ligand, prevent any deposition on the mask. Complicated edge morphologies are avoided and high quality Group III-V material is left only in the unmasked areas. In accordance with the method of the invention, a gaseous mixture including at least one organometallic halide compound of a Group III metal and at least one compound of a Group V element under suitable conditions of temperature and pressure are introduced into a MOVPE reaction chamber having a masked substrate to selectively deposit on the unmasked areas of the substrate an epitaxial layer of a III-V compound semiconductor.

The organic ligands fissure from the starting precursors of the invention to provide a final reaction product that is a metal mono-halgen, such as GaCl. Such monohalogen compounds have a strong metal-halogen bond that allows for the decomposition of the compound to a stable entity instead of free metal. The chemical entity does not react on the masking material until very high supersaturations are achieved. The nucleation of polycrystalline material is strongly suppressed. Masking materials, such as $SiO_2$, $SiN_x$, $SiON_x$, $Al_2O_3$ and AlN are used. In addition, the halogen compounds, such as HCl, resulting as a growth reaction by product in the growth environment, act to etch and remove any small embryonic crystals from the mask surface before a critical nuclei can be formed. These compounds react to form mono-halogen precursors in the gas phase which possess a high vapor pressure and do not adsorb strongly on masking surfaces at typical MOVPE growth temperatures.

Figure 2:
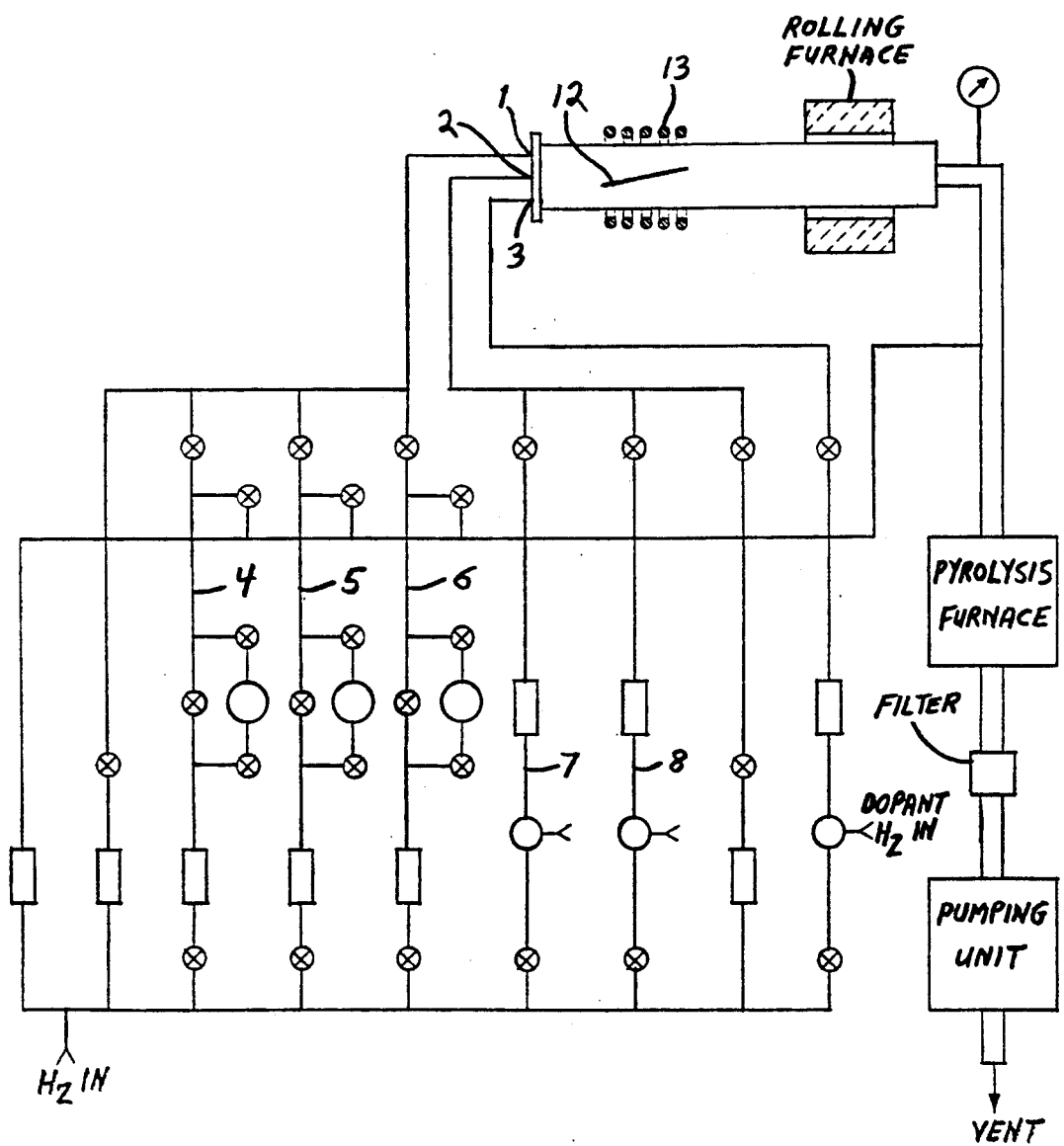
FIG. 2 schematically illustrates a cold wall MOVPE reactor and gas panel for use with the precursors of the invention.

Selective epitaxy can be achieved in both a cold wall system, as illustrated in FIG. 2, and a hot wall system as shown in FIG. 1, under their respective operating conditions. The cold wall system, similar to the hot wall system, is a flow system in which the source gases are introduced into the reactor chamber having pumps located on the reaction chamber to maintain the operating pressure. The pressure is determined by the amount and flow of the gas species. For the cold wall reactor system, the temperature is typically in the range of 500° to 800° C. and the pressure is typically in the range of 1 to 760 torr.

In a cold wall system a plurality of vapor flows is introduced into the reaction chamber including a Group III organometallic halide vapor having a mole fraction in the range of $10^{-3}$ to $10^{-4}$ and a Group V source vapor having a mole fraction in the range of 5 to 1000 times greater than the Group III organometallic halide vapor. The source of heat in the cold wall system may be for example radiant energy or rf induction to heat the susceptor to the growth temperature. In FIG. 2, heating is provided to vessel 12 by rf heating coil 13. The growth chemistry in the cold wall system, as in the hot wall, is controlled by the temperature, reactor pressure and mole fraction of reactants.

The use of at least one of the precursors of the invention enables selective epitaxy without complicated edge morphologies due to the diffusion of growth species from the mask surface to the edge of the growing film. No deposition is seen on the mask. Only high quality Group III-V compounds are deposited in the unmasked areas.

The semiconductor materials that can be selectively deposited include any combination of one or more Group III elements of Al, Ga and In and one or more Group V elements of As, P and Sb. Thus, any of the particular compounds described earlier with respect to epitaxial growth on the hot wall, low pressure system may be selectively deposited on a masked substrate.

While the invention has been particularly shown and described with respect to preferred embodiments thereof, it will be understood by those skilled in the art that the foregoing and other changes in form and detail may be made therein without departing from the spirit and scope of the invention which should be limited only by the scope of the appended claims.

What is claimed is:

1. A method of depositing III-V compounds on a semiconductor substrate comprising the step of:
   introducing at least one organometallic compound of the formula $MR_{2-y}X_{1+y}$ wherein
   M is a Group III metal atom
   R is an organic ligand or a halo-substituted organic ligand;
   X is an inorganic ligand and
   y is 0 or 1
   and at least one compound of a Group V element into a hot wall MOVPE system at temperatures and pressures sufficient to epitaxially deposit at least one III-V compound on a semiconductor substrate.

2. A method according to claim 1 wherein the pressure of the MOVPE system is maintained in the range of 0.001 to 10 torr.

3. A method according to claim 2 wherein the temperature of the MOVPE system is maintained at a temperature of 200°-800° C.

4. A method according to claim 1 wherein R is alkyl or halo-substituted alkyl; and X is halogen.

5. A method according to claim 1 including a second step of introducing a first of said organometallic compounds having a first M and a second of said organometallic compounds having a second M.

6. A method according to claim 1 wherein a doping compound is introduced.

7. A method according to claim 1 wherein the substrate is a masked substrate and the III-V compound is selectively deposited on unmasked areas of the substrate.

8. A method for epitaxially growing a III-V compound semiconductor on a substrate comprising:
   (a) positioning in a hot wall reaction chamber at least one substrate of a material having a surface suitable for epitaxial growth;
   (b) introducing into said hot wall reaction chamber a gaseous mixture including at least one organometallic halide compound of a Group III metal and at least one compound of a Group V element under conditions of suitable temperature and pressure; and
   (c) depositing on said at least one substrate an epitaxial layer of at least one III-V compound semiconductor.

9. A method as in claim 8 wherein the pressure of the reaction chamber is maintained in the range of 0.001 to 10 Torr.

10. A method as in claim 9 wherein said at least one organometallic halide compound is of the formula $MR_{2-y}X_{1+y}$ wherein
    M is a Group III metal atom,
    R is alkyl or halo-substituted alkyl,
    X is halogen, and
    y is 0 or 1

11. A method as in claim 10 wherein said III-V compound is GaAs.

12. A method as in claim 10 wherein said III-V compound is InP.

13. A method as in claim 10 wherein said at least one organometallic halide compound of a Group III element includes a first organometallic halide compound of a first Group III element and a second organometallic halide compound of a second Group III element.

14. A method as in claim 13 wherein said compound is $Al_xGa_{1-x}As$ where x is in the range of $0 \leq x \leq 1$.

15. A method as in claim 13 wherein said III-V compound is $Al_xGa_{1-x}P$ where x is in the range of $0 \leq x \leq 1$.

16. A method as in claim 13 wherein said at least one compound of a Group V element includes a first Group V element and a second Group V element.

17. A method as in claim 16 wherein III-V compound is $In_xGa_{1-x}As_yP_{1-y}$ where x is in the range $0 \leq x \leq 1$ and y is in the range $0 \leq y \leq 1$.

18. A method as in claim 13 wherein said at least one organometallic halide compound further includes a third organometallic halide compound of a third Group III element.

19. A method as in claim 18 wherein said III-V compound is $(Al_xGa_{1-x})_yIn_{1-y}P$ where x is in the range of $0 \leq x \leq 1$ and y is in the range $0 \leq y \leq 1$.

20. The method of claim 8 wherein step (a) includes vertically stacking a plurality of substrates and wherein said III-V compound semiconductor is deposited on each of said substrates substantially uniformly on said substrate surface.

21. The method of claim 20 wherein the plurality of substrates are stacked with a substrate to substrate separation of about 1-10 mm.

22. A method for selectively epitaxially growing a III-V compound semiconductor on a substrate comprising
   (a) positioning in a hot wall reaction chamber a masked substrate of a material suitable for epitaxial growth having masked and unmasked areas;

(b) introducing into said reaction chamber at least one organometallic halide compound of a Group III metal and at least one compound of a Group V element under conditions of suitable temperature and pressure; and (c) selectively depositing on the unmasked areas of the substrate an epitaxial layer of at least one III-V compound semiconductor.

23. A method as in claim 22 wherein the hot wall reaction chamber is heated to a temperature in the range of to 200° to 800° C.

24. A method as in claim 23 wherein the pressure of the reaction chamber is maintained in the range of 0.001 to 10 torr.

25. A method as in claim 22 wherein said at least one organometallic halide compound is of the formula $$MR_{2-y}X_{1+y}$$

wherein
M is a Group III metal atom,
R is alkyl or halo-substituted alkyl,
X is halogen, and
y is 0 or 1.

26. A method as in claim 22 wherein said III-V compound is GaAs.

27. A method as in claim 26 wherein said organometallic halide compound is $Ga(C_2H_5)_2Cl$.

28. A method as in claim 22 wherein said III-V compound is InP.

29. A method as in claim 22 wherein said at least one organometallic halide compound of a Group III element includes a first organometallic halide compound of a first Group III element and a second organometallic halide compound of a second Group III element.

30. A method as in claim 29 wherein said III-V compound is $Al_xGa_{1-x}As$ where x is in the range of $0 \leq x \leq 1$.

31. A method as in claim 29 wherein said III-V compound is $Al_xGa_{1-x}P$ where x is the range of $0 \leq x \leq 1$.

32. A method as in claim 22 wherein said at least one compound of a Group V element includes a first Group V element and a second group V element.

33. A method as in claim 32 wherein said III-V compound is $IN_xGa_{1-x}As_yP_{1-y}$ where x is in the range $0 \leq x \leq 1$ and y is in the range $0 \leq y \leq 1$.

34. A method as in claim 29 wherein said at least one organometallic halide compound further includes a third organometallic halide compound of a third Group III element.

35. A method as in claim 34 wherein said III-V compound is $(Al_xGa_{1-x})_zIn_{1-y}P$ where x is in the rang eof $0 \leq x \leq 1$ and y is in the range $0 \leq y \leq 1$.

* * * * *

UNITED STATES PATENT AND TRADEMARK OFFICE
CERTIFICATE OF CORRECTION

PATENT NO. : 5,036,022

DATED : July 30, 1991

INVENTOR(S) : Thomas F. Kuech, et al.

It is certified that error appears in the above-identified patent and that said Letters Patent is hereby corrected as shown below:

Column 9, line 11, Claim 23: "of to" should read --of--.

Column 10, line 26, Claim 35: "rang eof" should read as --range of--

Signed and Sealed this

Twenty-fourth Day of November, 1992

*Attest:*

DOUGLAS B. COMER

*Attesting Officer*      *Acting Commissioner of Patents and Trademarks*